(12) United States Patent
Lee et al.

(10) Patent No.: US 10,305,494 B2
(45) Date of Patent: May 28, 2019

(54) DELAY LOCKED LOOP INCLUDING A DELAY CODE GENERATOR

(71) Applicant: SAMSUNG ELECTRONICS CO., LTD., Suwon-si, Gyeonggi-Do (KR)

(72) Inventors: Hoon Lee, Seoul (KR); Donghun Lee, Suwon-si (KR); Jaewon Lee, Daejeon (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 26 days.

(21) Appl. No.: 15/599,191

(22) Filed: May 18, 2017

(65) Prior Publication Data

US 2017/0338825 A1  Nov. 23, 2017

(30) Foreign Application Priority Data

May 23, 2016 (KR) .................. 10-2016-0062897

(51) Int. Cl.
| | |
|---|---|
| *H03L 7/06* | (2006.01) |
| *H03L 7/081* | (2006.01) |
| *H03L 7/091* | (2006.01) |
| *H03K 19/20* | (2006.01) |
| *H03K 5/131* | (2014.01) |
| *H03K 5/00* | (2006.01) |

(52) U.S. Cl.
CPC .......... *H03L 7/0818* (2013.01); *H03K 5/131* (2013.01); *H03K 19/20* (2013.01); *H03L 7/091* (2013.01); *H03K 2005/00234* (2013.01)

(58) Field of Classification Search
CPC ....... H03L 7/0818; H03L 7/091; H03K 5/131; H03K 19/20; H03K 2005/00234

USPC .................................................. 327/147–159
See application file for complete search history.

(56) References Cited

U.S. PATENT DOCUMENTS

| | | | |
|---|---|---|---|
| 6,822,494 B2 | 11/2004 | Kim | |
| 7,746,134 B1 | 6/2010 | Lu et al. | |
| 8,085,074 B1 | 12/2011 | Janardhanan et al. | |
| 8,319,535 B2 | 11/2012 | Jang et al. | |
| 8,874,999 B1 | 10/2014 | Taylor et al. | |
| 9,054,715 B2* | 6/2015 | Kim ................. | H03L 7/0814 |
| 9,397,671 B2* | 7/2016 | Kim ................. | H03L 7/0814 |
| 9,443,565 B2* | 9/2016 | Jung ................ | G11C 7/02 |
| 9,564,190 B2* | 2/2017 | Jung ................ | G11C 7/02 |
| 9,997,221 B2* | 6/2018 | Jung ................ | G11C 7/02 |
| 2003/0206043 A1* | 11/2003 | Chung ............. | G11C 7/16 327/156 |

(Continued)

*Primary Examiner* — Ryan Jager
(74) *Attorney, Agent, or Firm* — F. Chau & Associates, LLC

(57) ABSTRACT

A delay locked loop includes a delay line, a delay circuit, a phase detector, a delay code generator, and a delay controller. The delay line may delay an input clock signal in units of unit delay in response to a delay control code to generate an output clock signal. The delay circuit may delay the output clock signal to generate a delay clock signal. The phase detector may compare the input clock signal and the delay clock signal to generate a phase detection signal. The delay code generator may compare the input clock signal and the delay clock signal to detect a phase difference therebetween, and generate a delay code using the phase difference. The delay controller may generate the delay control code using the delay code and the phase detection signal.

13 Claims, 15 Drawing Sheets

(56) References Cited

U.S. PATENT DOCUMENTS

| | | | |
|---|---|---|---|
| 2007/0085581 A1* | 4/2007 | Ku | H03L 7/0802 |
| | | | 327/158 |
| 2012/0044002 A1* | 2/2012 | Kim | H03L 7/0816 |
| | | | 327/158 |
| 2013/0121094 A1 | 5/2013 | Zerbe et al. | |
| 2013/0223179 A1* | 8/2013 | Na | H03L 7/18 |
| | | | 365/233.1 |
| 2014/0176206 A1* | 6/2014 | Kim | H03L 7/0814 |
| | | | 327/158 |
| 2014/0293719 A1* | 10/2014 | Jung | G11C 7/02 |
| | | | 365/194 |
| 2015/0236706 A1* | 8/2015 | Kim | H03L 7/0802 |
| | | | 327/158 |

* cited by examiner

| On [Control Signal] | CLK_i | n0 |
|---|---|---|
| 0 | 0 | 1 |
| 0 | 1 | 1 |
| 1 | 0 | 1 |
| 1 | 1 | 0 |

→ Ignore CLK_i signal

→ Pass CLK_i signal

DELAY LOCKED LOOP INCLUDING A DELAY CODE GENERATOR

CROSS-REFERENCE TO RELATED APPLICATION

This U.S. non-provisional patent application claims priority under 35 U.S.C. § 119 to Korean Patent Application No. 10-2016-0062897, filed on May 23, 2016 in the Korean Intellectual Property Office (KIPO), the disclosure of which is incorporated by reference herein in its entirety.

TECHNICAL FIELD

Exemplary embodiments of the inventive concept relate to delay locked loops, and more particularly, to a delay locked loop including a delay code generator.

DISCUSSION OF RELATED ART

A delay locked loop (DLL) is used to provide an internal clock having a phase which is ahead of a certain period of time of an input clock. In a semiconductor memory device having a relatively high degree of integration such as a dynamic random access memory (DRAM), an internal clock is generated to operate in synchronization with an external clock.

To provide a stable internal clock, the delay locked loop determines a delay time through a loop to generate a clock and locks the determined delay time to generate the internal clock. This process is called a lock process. A DRAM device uses the delay locked loop to complete the lock process within a reference time.

The delay locked loop in a DRAM may be used together with a duty cycle correction circuit to generate a high quality internal clock. In this case, by having the delay locked loop with a shorter lock time characteristic, the lock process of the delay locked loop and a duty cycle correction operation of the duty cycle correction circuit may be completed within a predetermined reference time.

SUMMARY

According to an exemplary embodiment of the inventive concept, a delay locked loop includes a delay line, a delay circuit, a phase detector, a delay code generator, and a delay controller. The delay line may delay an input clock signal in units of unit delay in response to a delay control code to generate an output clock signal. The delay circuit may delay the output clock signal to generate a delay clock signal. The phase detector may compare the input clock signal and the delay clock signal to generate a phase detection signal. The delay code generator may compare the input clock signal and the delay clock signal to detect a phase difference therebetween and to generate a delay code using the phase difference. The delay controller may generate the delay control code using the delay code and the phase detection signal.

According to an exemplary embodiment of the inventive concept, a delay locked loop includes a delay line, a delay circuit, a phase detector, a delay code generator, and a delay controller. The delay line may delay an input clock signal to generate an output clock signal in response to a delay control code. The delay circuit may delay the output clock signal to generate a delay clock signal. The phase detector may compare the input clock signal and the delay clock signal to detect a phase difference therebetween and generate a phase detection signal and an error pulse, having a pulse width which is proportional to the phase difference, using the phase difference. The delay code generator may generate a delay code using the error pulse. The delay controller may generate the delay control code using the delay code and the phase detection signal.

According to an exemplary embodiment of the inventive concept, in a method of performing a coarse lock process using a delay locked loop, an input clock signal and a delay clock signal are received at a phase detector. The delay clock signal is an output clock signal of the delay locked loop that is delayed for a predetermined amount of time. A phase difference between the input clock signal and the delay clock signal is determined by the phase detector to generate a phase detection signal. The input clock signal and the delay clock signal are received at a delay code generator. A delay code is generated by the delay code generator using the input clock signal and the delay clock signal. The phase detection signal and the delay code are received at a delay controller. A delay control code is generated by the delay controller using the phase detection code and the delay code. The input clock signal and the delay control code are received at a delay line to generate the output clock signal.

BRIEF DESCRIPTION OF THE FIGURES

The above and other features of the inventive concept will be more clearly understood by describing in detail exemplary embodiments thereof with reference to the accompanying drawings.

DETAILED DESCRIPTION OF THE EMBODIMENTS

Figure 1:
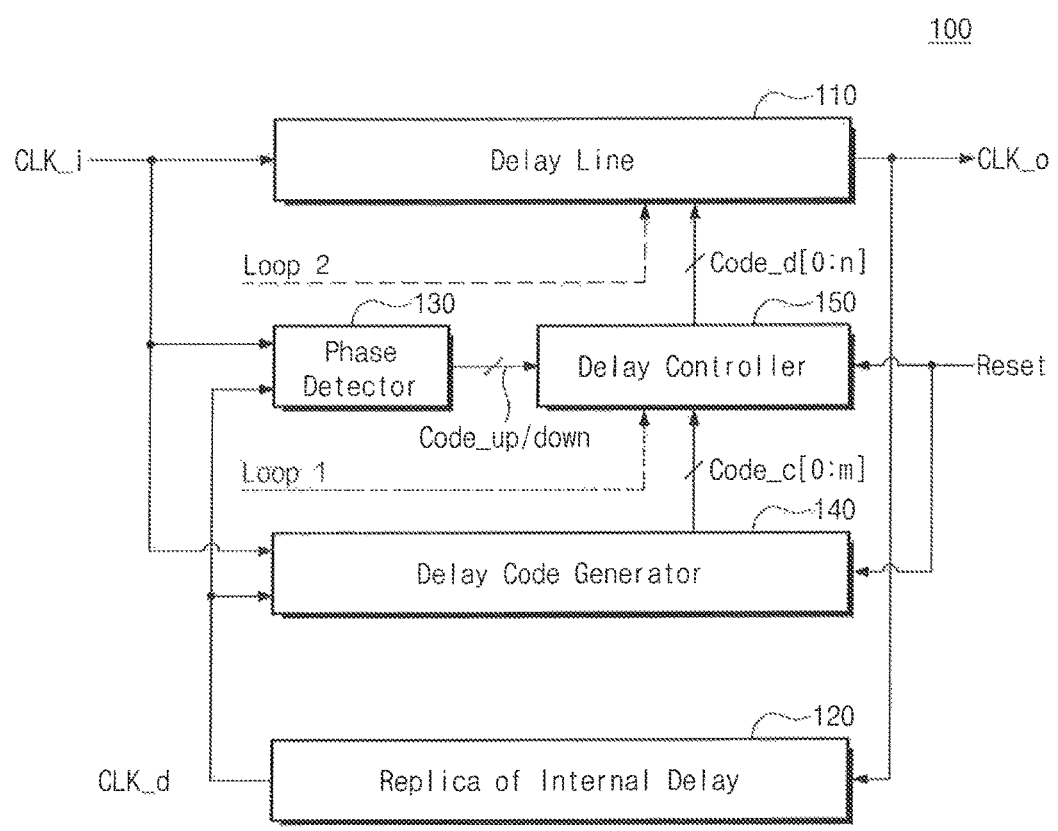
FIG. 1 is a block diagram illustrating a delay locked loop according to an exemplary embodiment of the inventive concept.

Exemplary embodiments of the inventive concept will be described more fully hereinafter with reference to the accompanying drawings. Like reference numerals may refer to like elements throughout this application.

FIG. 1 is a block diagram illustrating a delay locked loop according to an exemplary embodiment of the inventive concept. Referring to FIG. 1, the delay locked loop 100 may include a delay line 110, a replica of internal delay 120, a phase detector 130, a delay code generator 140, and a delay controller 150.

The delay locked loop 100 receives an input clock signal CLK_i and delays the received input clock signal CLK_i for a certain time to generate an output clock signal CLK_o. Since a delay time must be locked in order to generate a stable output clock signal CLK_o, the delay locked loop 100 performs a process of locking a clock signal generation loop. The lock operation or process may be defined as an operation where the delay locked loop 100 determines a delay time to maintain it. For example, when a phase difference between the input clock signal CLK_i and a delay clock signal CLK_d enters a specific range, the phase detector 130 may generate a lock completion signal and a lock process may be completed by the lock completion signal. Generally, the lock process may include a coarse lock process that performs a lock in units of relatively large unit delays and a fine lock process that performs a lock in units of relatively small unit delays. For example, the coarse lock process and the fine lock process may be performed at substantially the same time. Alternatively, after the coarse lock process is completed, the fine lock process may be performed. It is assumed that the delay locked loop 100 performs the fine lock process after the coarse lock process is completed.

The delay locked loop 100 of the present inventive concept may reduce the time taken to perform the coarse lock process. Since the fine lock process and the method of generating the lock completion signal have little relation to the present inventive concept, a description thereof is omitted. However, an additional circuit for the fine lock process and the method of generating the lock completion signal may be added to the delay locked loop 100.

The delay line 110 is connected to the replica of internal delay 120 and the delay controller 150. The delay line 110 receives the input clock signal CLK_i, and delays the received input clock signal CLK_i for a predetermined delay according to a delay control code (Code_d[0:n]) to generate the output clock signal CLK_o. The delay control code (Code_d[0:n]) may be provided from the delay controller 150. The delay line 110 may include a plurality of delay stages for delaying the input clock signal CLK_i in units of unit delays. A single delay stage, among the plurality of delay stages, may include a plurality of logic circuits. A configuration and operation of the delay line 110 will be described below with reference to FIGS. 3 to 6.

The replica of internal delay 120 is connected to the delay line 110, the phase detector 130, and the delay code generator 140. The replica of internal delay 120 delays the output clock signal CLK_o for a delay time for which the delay locked loop 100 desires to compensate and generates the delay clock signal CLK_d. For example, the delay locked loop 100 may be used in a DRAM device and in this case, the replica of internal delay 120 may be designed to compensate for a delay time caused by delay components that exist on a transmission path of the input clock signal CLK_i inside the DRAM device.

The phase detector 130 is connected to the delay line 110, the replica of internal delay 120, the delay code generator 140, and the delay controller 150. The phase detector 130 receives the input clock signal CLK_i and the delay clock signal CLK_d, and determines a phase difference between them to generate a phase detection signal. For example, the phase detection signal may include a code rising signal (Code_up) and a code falling signal (Code_down). The code rising signal (Code_up) is a signal for increasing a delay time of the delay clock signal CLK_d in units of unit delays and the code falling signal (Code_down) is a signal for reducing a delay time in units of unit delays.

In the case where the delay clock signal CLK_d is ahead of the input clock signal CLK_i, the phase detector 130 generates the code rising signal (Code_up) to increase a delay time for the output clock signal CLK_o. In contrast, in the case where the delay clock signal CLK_d falls behind the input clock signal CLK_i, the phase detector 130 generates the code falling signal (Code_down) to reduce a delay time for the output clock signal CLK_o. In other words, the phase detector 130 performs a comparison operation and a phase detection signal generating operation to reduce the phase difference described above.

The delay code generator 140 is connected to the replica of internal delay 120, the phase detector 130, and the delay controller 150. The delay code generator 140 receives the input clock signal CLK_i and the delay clock signal CLK_d, and determines a phase difference between them to generate a delay code (Code_c[0:m]) with respect to a time that is proportional to the phase difference. For example, when the phase difference increases, the delay code generator 140 increases a code value of the delay code (Code_c[0:m]), and when the phase difference decreases, the delay code generator 140 reduces a code value of the delay code (Code_c[0:m]).

The delay code (Code_c[0:m]) is provided to the delay controller 150 and includes an initial delay control code (Code_d[0:n]) of the delay line 110 with respect to the phase difference. Thereafter, the delay code (Code_c[0:m]) combines with the phase detection signal to generate an updated delay control code (Code_d[0:n]). For example, the number (m+1) of bits of the delay code (Code_c[0:m]) may be the same as the number (n+1) of bits of the delay control code (Code_d[0:n]). Alternatively, the number (m+1) of bits of the delay code (Code_c[0:m]) may be less than the number (n+1) of bits of the delay control code (Code_d[0:n]). This will be described below with reference to FIG. 10. A configuration and operation of the delay code generator 140 will be described below with reference to FIGS. 7 to 13.

The delay controller 150 may be connected to the delay line 110, the phase detector 130, and the delay code generator 140. The delay controller 150 generates the delay control code (Code_d[0:n]) for controlling a delay time of the delay line 110 using the delay code (Code_c[0:m]) and the phase detection signal. For example, the number of bits of the delay control code (Code_d[0:n]) may be decided in proportion to the number of delay stages included in the delay line 110. In other words, each bit of the delay control code (Code_d[0:n]) may determine whether to use a corresponding one of the delay stages of the delay line 110. For example, the delay controller 150 may include shift registers. In this case, the delay controller 150 may increase or decrease the delay control code (Code_d[0:n]) by one bit. Accordingly, a delay time of the delay line 110 may increase or decrease by one unit delay.

The delay controller 150 of the present inventive concept generates the initial delay control code (Code_d[0:n]) using the delay code (Code_c[0:m]). In FIG. 1, this process is illustrated as a first loop (Loop 1). After that, in the case where the delay locked loop 100 is coarse-locked by the initial delay control code (Code_d[0:n]), the coarse lock process is finished. In the case where the delay locked loop 100 is not coarse-locked by the initial delay control code (Code_d[0:n]), the delay controller 150 shifts the initial delay control code (Code_d[0:n]) to perform the coarse lock. In FIG. 1, this process is illustrated as a second loop (Loop 2). The delay code (Code_c[0:m]) and the delay control code (Code_d[0:n]) generated by the delay code generator 140 and the delay controller 150, respectively, may be reset by a reset signal (Reset). This will be described below with reference to FIG. 2.

The delay controller 150 of the present inventive concept performs a coarse lock process beginning with the delay control code (Code_d[0:n]) generated based on a code value of the initial delay code (Code_c[0:m]). As described above, the initial delay code (Code_c[0:m]) is a code value with respect to a phase difference at a first cycle of the input clock signal CLK_i and the output clock signal CLK_o. Since the delay locked loop 100 of the present inventive concept does not compare a phase difference with respect to all values of the delay control code (Code_d[0:n]), operation time of the coarse lock process may be reduced.

Figure 2:
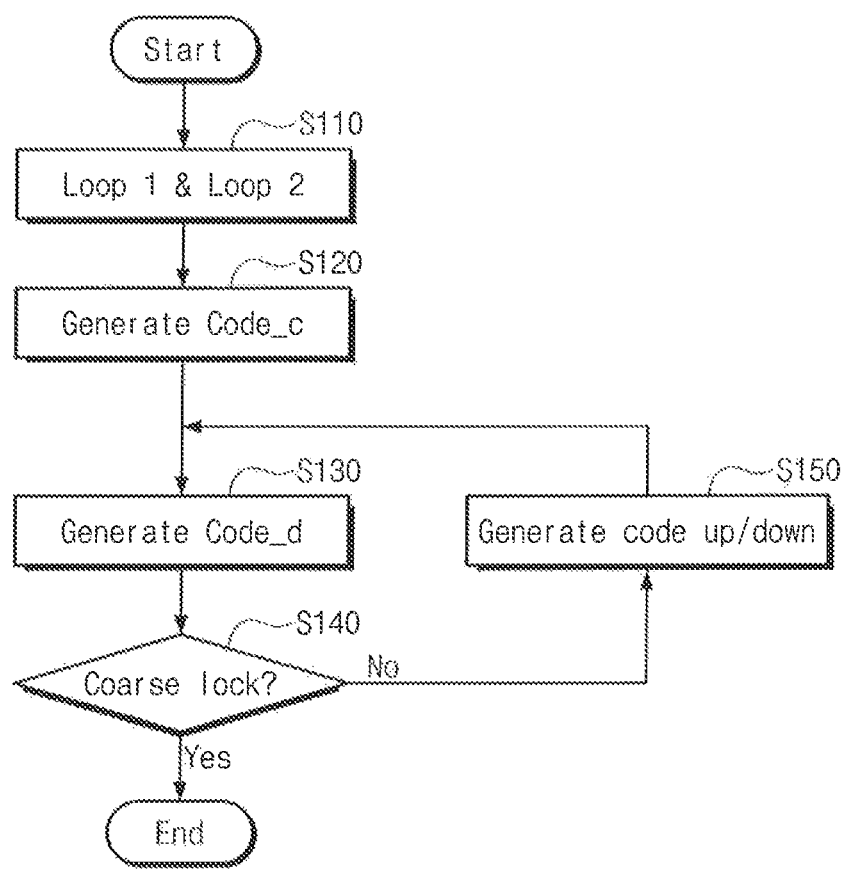
FIG. 2 is a flowchart illustrating an operation of the delay locked loop of FIG. 1 according to an exemplary embodiment of the inventive concept.

FIG. 2 is a flowchart illustrating an operation of the delay locked loop of FIG. 1 according to an exemplary embodiment of the inventive concept. FIG. 2 will be described with reference to FIG. 1. Referring to FIG. 2, the delay locked loop 100 may perform the coarse lock process.

In an operation S110, the delay locked loop 100 performs the first and second loop (Loop 1, Loop 2) operations with respect to the first cycle of the input clock signal CLK_i and the delay clock signal CLK_d. In an operation S120, the delay code generator 140 receives the input clock signal CLK_i and the delay clock signal CLK_d to generate the initial delay code (Code_c[0:m]) through the second loop (Loop 2). After that, the delay code generator 140 maintains the initial delay code (Code_c[0:m]) after the first cycle.

In an operation S130, the delay controller 150 receives the phase detection signal and the delay code (Code_c[0:m]) to generate the delay control code (Code_d[0:n]) through the first loop (Loop 1). In the first cycle, the delay controller 150 does not respond to the phase detection signal and generate the delay control code (Code_d[0:n]) based on the delay code (Code_c[0:m]).

In an operation S140, the phase detector 130 compares the input clock signal CLK_i and the delay clock signal CLK_d to determine whether the delay locked loop 100 is coarse-locked. In the case where the delay locked loop 100 is not coarse-locked (operation S140:No), the delay locked loop 100 performs an operation S150. In the case where the delay locked loop 100 is coarse-locked (operation S140:Yes), the delay locked loop 100 generates a coarse lock signal and the coarse lock process is finished.

In the operation S150, the phase detector 130 generates a phase detection signal for adjusting the delay control code (Code_d[0:n]) with respect to a second cycle. As described above, the phase detector 130 generates the code rising signal (Code_up) or the code falling signal (Code_down) according to a phase of the delay clock signal CLK_d with respect to an input/output signal, and provides the generated code rising signal Code_up or the generated code falling signal Code_down to the delay controller 150. The delay controller 150 generates an updated delay control code (Code_d[0:n]) with respect to the second cycle and provides the updated delay control code (Code_d[0:n]) to the delay line (operation S130).

In the present exemplary embodiment of FIG. 2, after generating the initial delay code Code_c[0:m] with respect to the first cycle, the delay code generator 140 does not perform a phase comparison operation and a delay code update operation, and maintains the initial delay code (Code_c[0:m]). This is to minimize power consumption by preventing an unnecessary operation of the delay code generator 140. The operation in which the delay code generator 140 maintains the initial delay code (Code_c[0:m]) will be described below with reference to FIGS. 10 to 12.

After the first cycle, the delay code generator 140 may perform the phase comparison operation and code update operation at every cycle until the coarse lock is completed without stopping an operation. In this case, after the coarse lock is completed, the delay code generator 140 may operate to maintain the delay code (Code_c[m:0]) before a subsequent coarse lock is performed. In other words, after the operation S140:Yes, the delay locked loop 100 may perform the operation S120 of generating the delay code (Code_c[0:m]) again.

After the operations S110 to S150 are completed, the delay locked loop 100 may complete a lock process by performing a fine lock process. For example, thereafter, the delay locked loop 100 may perform a lock process with respect to a new frequency or a new environment again. In this case, the delay locked loop 100 may initialize the delay code (Code_c[m:0]) and the delay control code (Code_d[0:n]) by the reset signal (Reset) to perform a new lock process.

Figure 3:
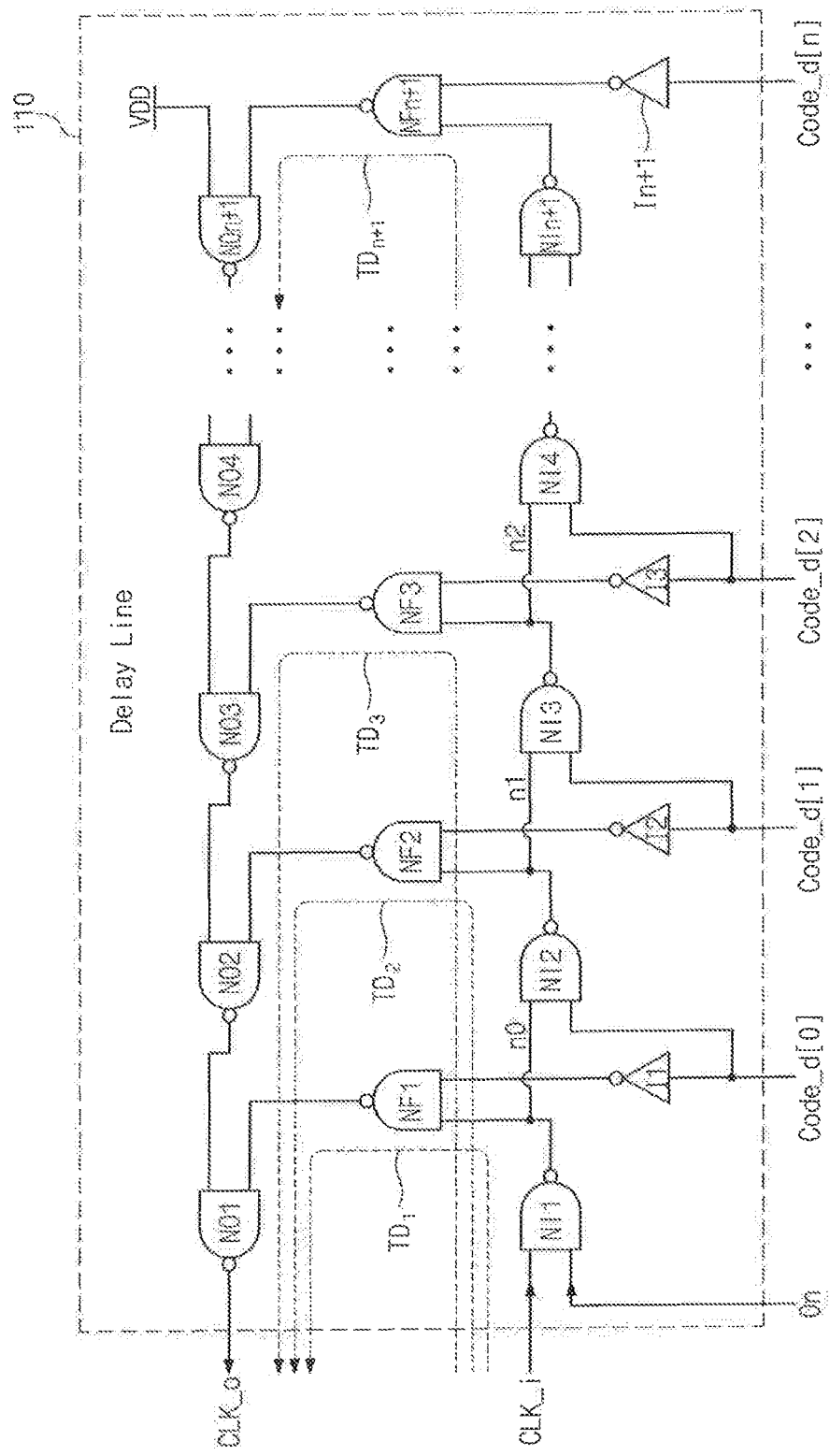
FIG. 3 is a circuit diagram illustrating a delay line of FIG. 1 according to an exemplary embodiment of the inventive concept.

FIG. 3 is a circuit diagram illustrating the delay line 110 of FIG. 1. Referring to FIG. 3, the delay line 110 may include first through n+1th input NAND logics (NI1 to NIn+1), first through n+1th feedback NAND logics (NF1 to NFn+1), first through n+1th output NAND logics (NO1 to NOn+1), and first through n+1th inverters (I1 to In+1). The delay line 110 may be turned on or off by a control signal (On). When the control signal (On) is logic '1', the delay line 110 operates and when the control signal (On) is logic '0', the delay line 110 does not operate and does not pass the input clock signal CLK_i. It is assumed below that the control signal (On) is logic '1'.

The first input NAND logic NI1, the first feedback NAND logic NF1, and the first output NAND logic NO1 may constitute a first delay stage. The first delay stage generates a first delay TD1. The first and second input NAND logics NI1 and NI2, the second feedback NAND logic NF2, and the first and second output NAND logics NO1 and NO2 may constitute a second delay stage. The second delay stage generates a second delay TD2. The first through third input NAND logics NI1 to NI3, the third feedback NAND logic NF3, and the first through third output NAND logics NO1 to NO3 may constitute a third delay stage. The third delay stage generates a third delay TD3. Similarly, the first through n+1th input NAND logics NI1 to NIn+1, the n+1th feedback NAND logic NFn+1, and the first through n+1th output NAND logics NO1 to NOn+1 may constitute an n+1th delay stage. The n+1th delay stage generates an n+1th delay TDn+1.

A delay time difference between adjacent delays is substantially the same. For example, the delay time difference between the first delay TD1 and the second delay TD2 constitutes the unit delay described above with reference to FIG. 1. When comparing a delay time of a signal passing through the first delay stage and a delay time of a signal passing through the second delay stage, the delay difference, or the delay unit of the delay line 110 of FIG. 3, may have a delay as much as a transmission time of a signal by two NAND logics, the second input NAND logic NI2 and the second output NAND logic NO2.

The above-described first through n+1th delay stages may be selected by delay control codes (Code_d[0:n]). The first through n+1th inverters (I1 to In+1) invert the delay control codes (Code_d[0:n]), respectively, to provide inverted delay control codes to the first through n+1th feedback NAND logics (NF1 to NFn+1), respectively. The second through n+1th input NAND logics (NI2 to Nin+1) directly receive the delay control codes (Code_d[0:n−1]), respectively. A method of selecting the first through n+1th delay stages will be described below with reference to FIG. 4.

Figure 4:
FIG. 4 is a drawing illustrating an operation of a NAND logic of FIG. 3 according to an exemplary embodiment of the inventive concept.

FIG. 4 is a drawing illustrating an operation of a NAND logic of FIG. 3 according to an exemplary embodiment of the inventive concept. Referring to FIG. 4, the first input NAND logic NI1 is illustrated as merely an example. An operation of the first input NAND logic NI1 may be applied to the first through n+1th input NAND logics (NI1 to Nin+1), the first through n+1th feedback NAND logics (NF1 to NFn+1), and the first through n+1th output NAND logics (NO1 to NOn+1), illustrated in FIG. 3.

The first input NAND logic NI1 receives the input clock signal CLK_i and the control signal (On) to output a signal to a node (n0). According to the control signal (On), the first input NAND logic NI1 inverts the input clock signal CLK_i to transmit the inverted input clock signal CLK_i to the node (n0) or to output logic '1'. Referring to a table illustrated in FIG. 4, in the case that the control signal (On) is logic '0', the first input NAND logic NI1 outputs only logic '1' regardless of a logic value of the input clock signal CLK_i. In the case that the control signal (On) is logic '1', the first input NAND logic NI1 inverts the input clock signal CLK_i to output the inverted input clock signal CLK_i to the node (n0).

Referring to FIG. 3 again, a method of selecting the first through n+1th delay stages by the delay control code (Code_d[0:n]) will be described. Hereinafter, it is assumed that n is 5. For example, in the case where a delay control code Code_d[0:5] is '000000', by a code value (logic '0') of a Code_d[0] which is a most significant bit (MSB) of the delay control code Code_d[0:5], the second input NAND logic NI2 ignores the input clock signal CLK_i transmitted through the node (n0) and outputs logic '1' to a node (n1). The first feedback NAND logic NF1 receives logic '1' inverted by the first inverter I1 to pass the input clock signal CLK_i transmitted through the node (n0). The passed input clock signal CLK_i is output as the output clock signal CLK_o by the first output NAND logic NO1.

As an example, it is assumed that the delay control code (Code_d[0:5]) is '110000'. In this case, the first and second feedback NAND logics NF1 and NF2 receive logic '0' inverted by the first and second inverters I1 and I2 and do not pass the input clock signal CLK_i transmitted through the node (n0) and the node (n1) to the next stage. The second and third input NAND logics NI2 and NI3, which receive logic '1', pass the input clock signal CLK_i. A clock signal transmitted through a node (n2) is not transmitted to the next stage by the fourth input NAND logic NI4 that received logic '0', but is transmitted to the third output NAND logic NO3 by the third feedback NAND logic NF3 that received logic '1'. As a result, the third delay stage is selected by the delay control code (Code_d[0:5]). The input clock signal CLK_i is output as the output clock signal CLK_o after the third delay TD3. Selection of the first through n+1th delay stages may be performed using substantially the same method as that described above.

Figure 5:
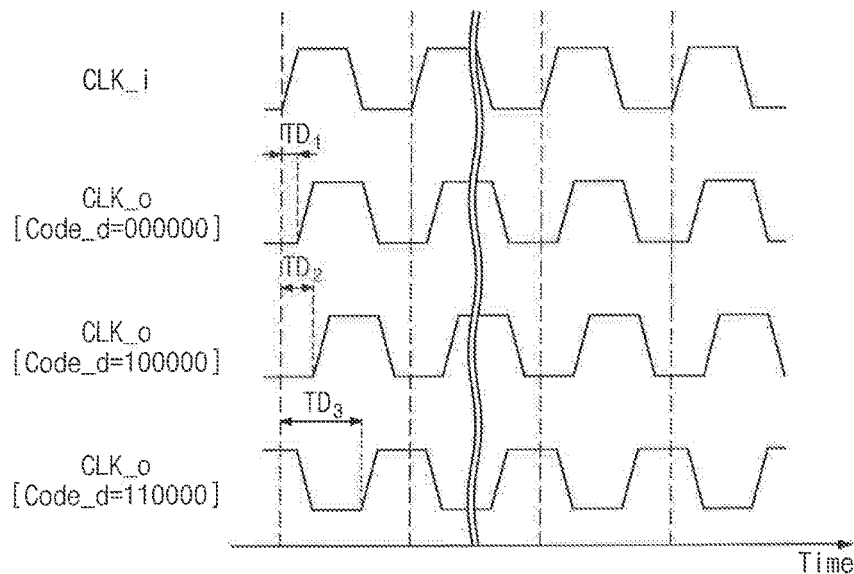
FIGS. 5 and 6 are timing diagrams illustrating an output clock signal according to an operation of a delay line of FIG. 3 according to an exemplary embodiment of the inventive concept.
Figure 6:
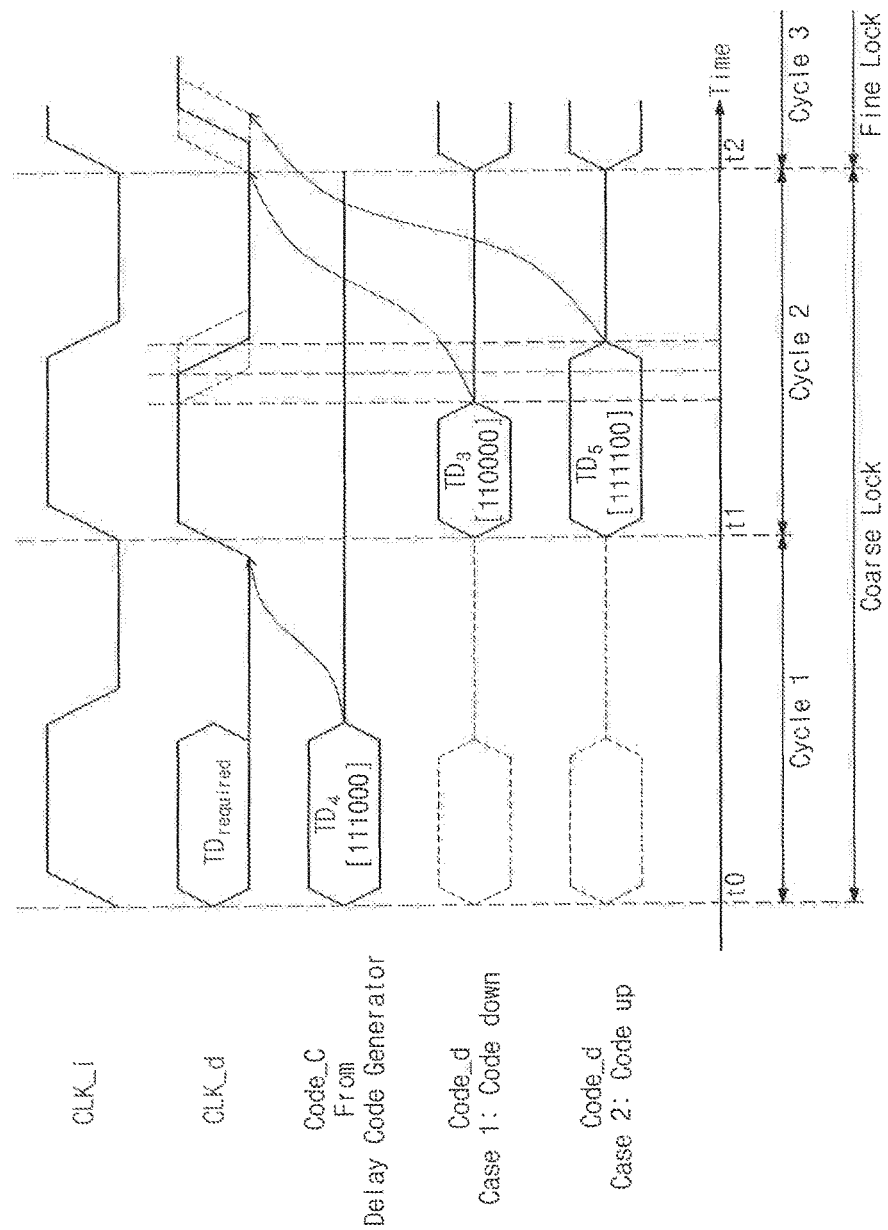

FIGS. 5 and 6 are timing diagrams illustrating an output clock signal according to an operation of a delay line of FIG. 3 according to an exemplary embodiment of the inventive concept.

Referring to the timing diagram of FIG. 5, a change of the output clock signal CLK_o according to the value of the delay control code (Code_d[0:5]) is illustrated. For example, in the case where the delay control code (Code_d[0:5]) is '000000', the input clock signal CLK_i is output as the output clock signal CLK_o after a delay time of the first delay TD1. In the case where the delay control code (Code_d[0:5]) is '100000', the input clock signal CLK_i is output as the output clock signal CLK_o after a delay time of the second delay TD2. In the case where the delay control code (Code_d[0:5]) is '110000', the input clock signal CLK_i is output as the output clock signal CLK_o after a delay time of the third delay TD3.

Referring to the timing diagram of FIG. 6, a change of the output clock signal CLK_o according to the delay code Code_c[0:m] and the delay control code (Code_d[0:n]) is illustrated. FIG. 6 will be described with reference to FIG. 1. Here, a time section (t0~t1) is defined as a first cycle of the input clock signal CLK_i and a time section (t1~t2) is defined as a second cycle of the input clock signal CLK_i.

In the time section (t0~t1), the delay code generator 140 generates the delay code (Code_c[05]) with respect to the first cycle. For example, it is assumed that a phase of the delay clock signal CLK_d is ahead of that of the input clock signal CLK_i by a required delay (TD_required). The corresponding delay code (Code_c[0:1]) is adjusted to compensate the required delay (TD_required). For example, the corresponding delay code (Code_c[0:1]) may have a code value of '111000'. '111000' may become an initial value of the delay code (Code_c[0:1]) by the delay controller 150 and be input to the delay line 110. The delay line 110 delays the input clock signal CLK_i for the fourth delay TD4 to generate the output clock signal CLK_o. As described above, '111000', which is the code value of the initial delay code (Code_c[0:1]), may be maintained until the delay locked loop 100 is reset.

At t1, the phase detector 130 can still detect a phase difference between the delay clock signal CLK_d and the input clock signal CLK_i. In this case, the phase detector 130 adjusts a delay time of the delay line 110 in the second cycle in units of unit delays. When the phase detection signal by the phase detector 130 is the code falling signal (Code_down) (case 1), the delay controller 150 outputs a code '110000' as the delay control code (Code_d[0:1]). When the phase detection signal by the phase detector 130 is the code rising signal (Code_up) (case 2), the delay controller 150 outputs a code '111100' as the delay control code (Code_d [0:1]). In the example of FIG. 6, it is assumed that the phase detector 130 outputs the code falling signal (Code_down).

At t2, the phase detector 130 detects that a phase difference between the delay clock signal CLK_d and the input clock signal CLK_i is within a certain range and then completes a coarse lock. Subsequently, the delay locked loop 100 may perform a fine lock process.

In FIG. 6, it is illustrated that the delay locked loop 100 completes a coarse lock at t2 after the second cycle. However, the delay locked loop 100 may complete a coarse lock at t1 after the first cycle or may complete the coarse lock after the second cycle. As described above, since the delay locked loop 100 scans the delay control code (Code_d[0:1]) not from '000000' but from the initial code value '111000' using the delay code (Code_c[0:1]), a time taken for the coarse lock process may be reduced.

Figure 7:
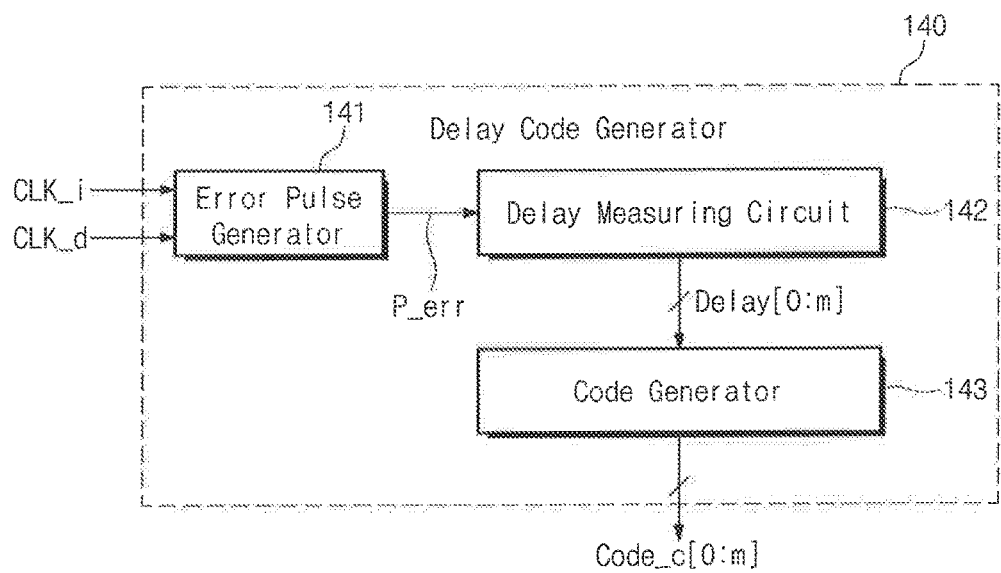
FIG. 7 is a block diagram illustrating a delay code generator of FIG. 1 according to an exemplary embodiment of the inventive concept.

FIG. 7 is a block diagram illustrating a delay code generator of FIG. 1 according to an exemplary embodiment of the inventive concept. Referring to FIG. 7, the delay code generator 140 may include an error pulse generator 141, a delay measuring circuit 142, and a code generator 143.

The error pulse generator 141 receives the input clock signal CLK_i and the delay clock signal CLK_d to detect a phase difference between them. Subsequently, the error pulse generator 141 generates an error pulse P_err having a pulse width which is in proportion to the phase difference. A configuration and operation of the error pulse generator 141 will be described below with reference to FIGS. 8 and 9.

The delay measuring circuit 142 receives the error pulse P_err from the error pulse generator 141 and generates measuring pulses whose number is proportional to the pulse width of the error pulse P_err. The delay measuring circuit 142 generates m number of measuring signals (Delay[0:m]) based on the measuring pulse and provides the generated m number of measuring signals (Delay[0:m]) to the code generator 143. A configuration and operation of the delay measuring circuit 142 will be described below with reference to FIGS. 10 to 12.

The code generator 143 receives the measuring signals (Delay[0:m]) from the delay measuring circuit 142 to generate the delay code (Code_c[m:0]) having m+1 bits. A configuration and operation of the code generator 143 will be described below with reference to FIG. 13.

Figure 8:
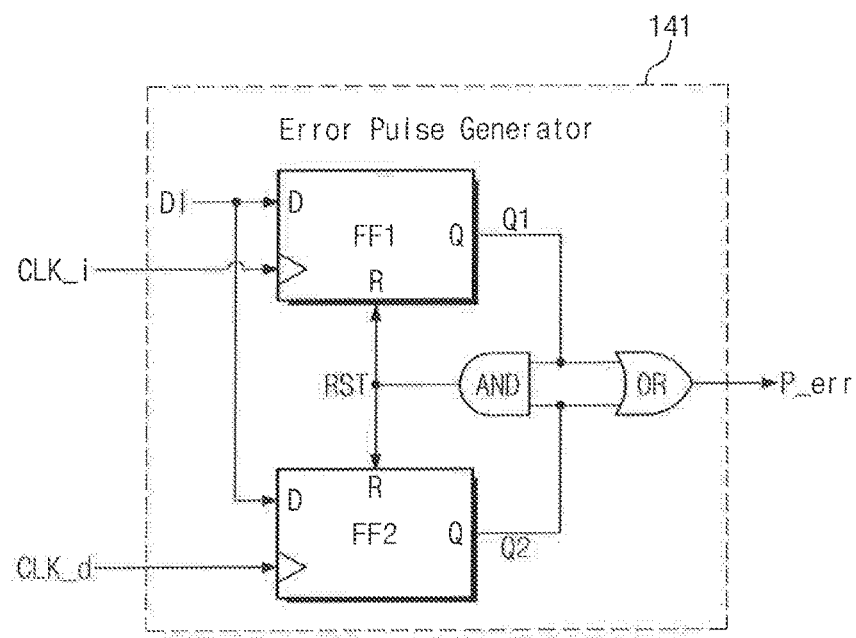
FIG. 8 is a block diagram illustrating an error pulse generator of FIG. 7 according to an exemplary embodiment of the inventive concept.

FIG. 8 is a block diagram illustrating an error pulse generator of FIG. 7 according to an exemplary embodiment of the inventive concept. Referring to FIG. 8, the error pulse generator 141 may include first and second flip-flops FF1 and FF2, a logical AND, and a logical OR.

The first flip-flop FF1 receives a data signal DI as an input signal and discriminates data of the data signal DI by a rising edge of the input clock signal CLK_i to generate a first discriminating signal Q1. The second flip-flop FF2 receives the data signal DI as an input signal and discriminates data of the data signal DI by a rising edge of the delay clock signal CLK_d to generate a second discriminating signal Q2.

The logical AND performs an AND operation on the first and second discriminating signals Q1 and Q2 to generate a pulse reset signal RST. The first and second flip-flops FF1 and FF2 receive the pulse reset signal RST to reset the first and second discriminating signals (Q1, Q2). The logical OR performs an OR operation on the first and second discriminating signals (Q1, Q2) to generate an error pulse P_err. Discriminating signals (Q1, Q2) of the first and second flop-flops FF1 and FF2 which are reset may have logic '0'. An operation of the error pulse generator 141 will be described below with reference to FIG. 9.

The first and second flop-flops FF1 and FF2 may discriminate the data signal DI based on a falling edge. For example, the error pulse generator 141 may stop an operation after the first cycle of the input clock signal CLK_i. As described above, this is to prevent an update of the delay code (Code_c[d:m]) by preventing generation of the error pulse P_err with respect to the second cycle and to maintain, by the delay code generator 140, the initial delay code (Code_c[0:m]). To this end, the data signal DI may be controlled to maintain logic '1' during the first cycle and to maintain logic '0' after the first cycle.

Figure 9:
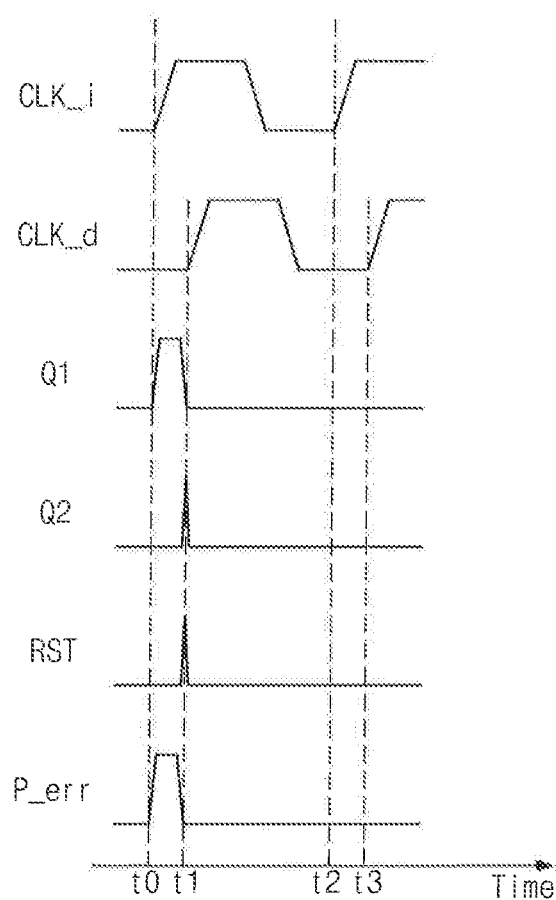
FIG. 9 is a timing diagram illustrating an error pulse according to an operation of the error pulse generator of FIG. 8 according to an exemplary embodiment of the inventive concept.

FIG. 9 is a timing diagram illustrating an error pulse according to an operation of the error pulse generator of FIG. 8 according to an exemplary embodiment of the inventive concept. Referring to FIG. 9, the error pulse generator 141 generates the error pulse P_err having a pulse width which is in proportion to a phase difference between the input clock signal CLK_i and the delay clock signal CLK_d.

At t0, the first flip-flop FF1 discriminates the data signal DI of logic '1' by the rising edge of the input clock signal CLK_i to generate the first discriminating signal Q1. The discriminating signal Q1 has logic '1'. The second flip-flop FF2 outputs logic '0' which is an initial value as the second discriminating signal Q2.

At t1, the second flip-flop FF2 discriminates the data signal DI of logic '1' by the rising edge of the delay clock signal CLK_d to generate the second discriminating signal Q2. The second discriminating signal Q2 has logic '1'.

At t1~t2, the first and second discriminating signals (Q1, Q2) have logic '1' and the logical AND receives the first and second discriminating signals (Q1, Q2) to generate the pulse reset signal RST of logic '1'. Accordingly, the first and second flip-flops FF1 and FF2 are reset and thus, the first and second discriminating signals (Q1, Q2) are reset to logic '0'. Consequently, the error pulse P_err is a pulse signal that maintains logic '1' during a time section t0~t1, which is a phase difference between the input clock signal CLK_i and the delay clock signal CLK_d.

For example, the time section t0~t1 may become the first cycle. As described above, the data signal DI may have logic '0'. Thus, at t2 and t3, the first and second flip-flops (FF1, FF2) output logic '0'.

Figure 10:
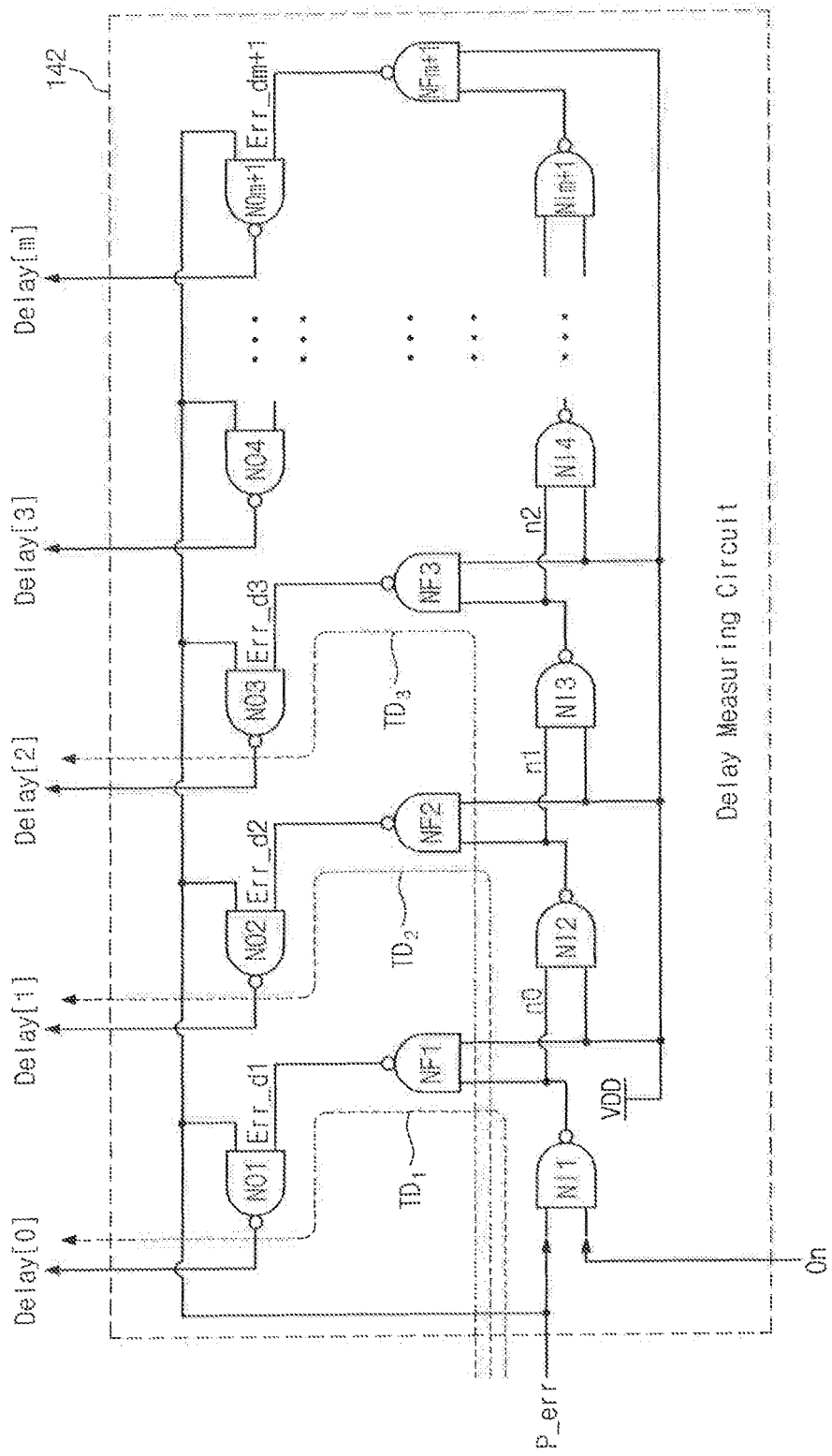
FIG. 10 is a circuit diagram illustrating a delay measuring circuit of FIG. 7 according to an exemplary embodiment of the inventive concept.

FIG. 10 is a circuit diagram illustrating a delay measuring circuit of FIG. 7 according to an exemplary embodiment of the inventive concept. The delay measuring circuit 142 may include first through m+1th input NAND logics (NI1 to NIm+1), first through m+1th feedback NAND logics (NF1 to NFm+1), and first through m+1th output NAND logics (NO1 to NOm+1).

The delay measuring circuit 142 does not include the first through n+1th inverters (N1 to Nn+1) as compared with the delay line 110 of FIG. 3. Accordingly, each of the second through m+1th input NAND logics (NI2 to NIm+1) receives a driving voltage VDD as a control input signal.

The delay measuring circuit 142 may be designed to have substantially the same unit delay as the delay line 110 by modeling the delay line 110. In other words, a configuration of a logical circuit constituting a delay stage of the delay measuring circuit 142 and first through m+1th delays (TD1 to TDm+1) are substantially the same as a delay of the delay line 110. Thus, a description thereof will be omitted. Herein, delay values obtained by subtracting a delay of one output NAND logic from the first through m+1th delay (TD1 to TDm+1) are defined as first through m+1th error delays (TDD1 to TDDm+1), respectively.

The delay measuring circuit 142 receives the error pulse P_err and generates first through m+1th error signals (Err_d1 to Err_dm+1) which are output after the first through m+1th error delays (TDD1 to TDDm+1). The delay measuring circuit 142 compares the first through m+1th error signals (Err_d1 to Err_dm+1), which are output after being delayed for different delay times, with the error pulse P_err to generate a measuring pulse. Since the measuring pulse is generated only when the first through m+1th error signals (Err_d1 to Err_dm+1) and the error pulse P_err output logic '1', an output NAND that receives an error signal having a delay greater than the pulse width of the error pulse P_err cannot generate a measuring pulse. A method of generating a measuring pulse will be described in detail with reference to FIG. 11.

The delay measuring circuit 142 may be designed to have a delay k, or 1/k times as long as a unit delay, by modeling a size of the delay line 110 1/k or k times. The delay measuring circuit 142 may include a smaller number of delay stages as compared with the delay line 110. In this case, as described with reference to FIG. 1, 'm+1', which is the number of bits of the measuring signal (Delay[0:m]) and the delay code (Code_c[0:m]), becomes smaller than 'n+1', which is the number of bits of the delay control code (Code_d[0:n]).

For example, since the error pulse P_err drives a plurality of output NANDs, the delay measuring circuit 142 may further comprise a buffer for reducing a drive loading of the error pulse P_err. The buffer may include a plurality of inverters.

Figure 11:
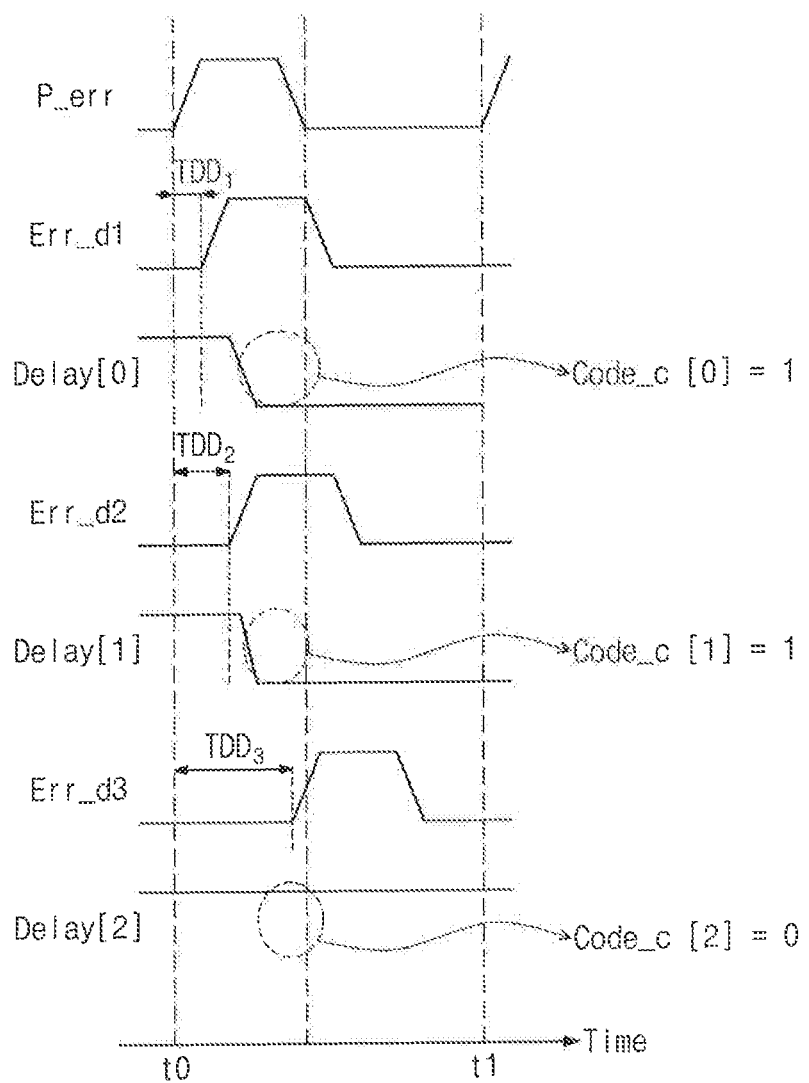
FIG. 11 is a timing diagram illustrating an operation of the delay measuring circuit of FIG. 10 according to an exemplary embodiment of the inventive concept.

FIG. 11 is a timing diagram illustrating an operation of the delay measuring circuit of FIG. 10 according to an exemplary embodiment of the inventive concept. FIG. 11 will be described with reference to FIGS. 7 through 10. Referring to FIG. 11, the delay measuring circuit 142 may generate measuring pulses whose number is proportional to the pulse width of the error pulse P_err.

The first feedback NAND logic NF1 generates a first error signal Err_d1 being delayed for a first error delay TDD1 from the error pulse P_err. The first output NAND logic NO1 performs an AND operation of the error pulse P_err and the first error signal Err_d1 to generate a measuring pulse and outputs the generated measuring pulse as a measuring signal (Delay[0]). After that, the code generator 143 of FIG. 7 receives the measuring signal (Delay[0]) to generate a delay code (Code_c[0]) having logic '1'.

The second feedback NAND logic NF2 generates a second error signal Err_d2 being delayed for a second error delay TDD2 from the error pulse P_err. The second output NAND logic NO2 performs an AND operation of the error pulse P_err and the second error signal Err_d2 to generate a measuring pulse and outputs the generated measuring pulse as a measuring signal (Delay[1]). After that, the code generator 143 receives the measuring signal (Delay[1]) to generate a delay code (Code_c[1]) having logic '1'.

In the case where the first through m+1th feedback NAND logic (NF1 to NFm+1) are general NAND logics, the measuring signal Delay[0,1] may be output as a pulse signal whose value returns to an original value after a specific period of time. The first through m+1th feedback NAND logic (NF1 to NFm+1) may be designed such that they charge a voltage level of logic '1' as an initial value to maintain the voltage level, and voltage levels of their internal nodes are discharged according to an input signal to output logic '0'. This will be described below with reference to FIG. 12. Herein, the 'measuring pulse' is not a general pulse signal that outputs a logic level which is changed only during a certain time section, but is a signal of which a level is changed from logic '1' to logic '0' or from logic '0' to logic '1' to maintain the changed level. This is to distinguish between a measuring signal (Delay[0:m]) of which a level is changed and a measuring signal (Delay[0:m]) of which a level is not changed.

The third feedback NAND logic NF3 generates a third error signal Err_d3 being delayed for a third error delay TDD3 from the error pulse P_err. The third output NAND logic NO3 performs an AND operation of the error pulse P_err and the third error signal Err_d3 to generate a measuring pulse and outputs the generated measuring pulse as a measuring signal (Delay[2]). Since the measuring signal (Delay[2]) maintains logic '0', the code generator 143 receives the measuring signal (Delay[2]) to generate a delay code (Code_c[1]) having logic '0'.

Similarly, the third through m+1th feedback NAND logics (NF3 to NFm+1) do not generate a measuring pulse. Thus, the delay measuring circuit 142 outputs each bit of measuring signals Delay[3:m] as logic '1' and the code generator 143 outputs each bit of the delay codes (Code_c[3:m]) as logic '0'. Consequently, in the case where m is 5, the delay code (Code_c[0:1]) becomes a code '110000'.

Figure 12:
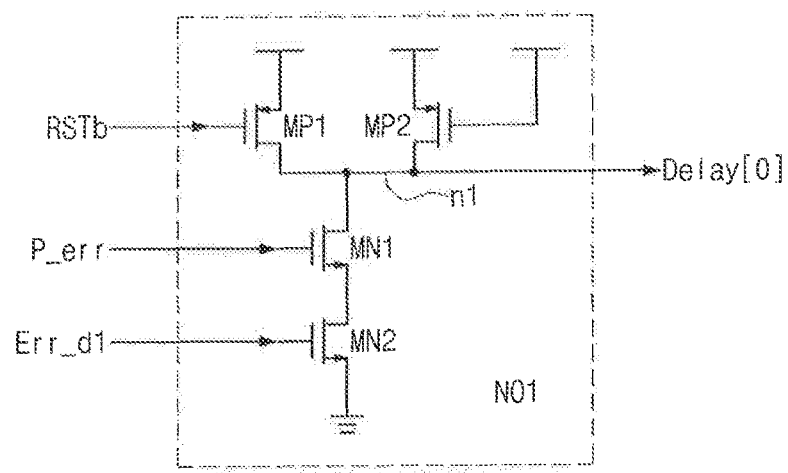
FIG. 12 is a circuit diagram illustrating an output NAND logic of FIG. 10 according to an exemplary embodiment of the inventive concept.

FIG. 12 is a circuit diagram illustrating an output NAND logic of FIG. 10 according to an exemplary embodiment of the inventive concept. Referring to FIG. 12, the delay measuring circuit 142 can maintain the initial delay code (Code_c[0:m]) after the first cycle of the input clock signal CLK_i.

Referring to FIG. 12, the first output NAND logic NO1 is illustrated. An operation of the first output NAND logic NO1 may be applied to the first through m+1th output NAND logics (NO1 to Nom+1) illustrated in FIG. 11.

As illustrated above, the delay locked loop 100 may perform a new lock process by initializing, by a reset signal, the delay code (Code_c[0:m]) and the delay control signal (Code_d[0:n]). Here, a reset bar signal RSTb is a signal obtained by inverting the reset signal. The reset signal is a different signal from the pulse reset signal RST illustrated in FIG. 8.

The reset bar signal RSTb may maintain a level of logic '0' before an operation of the delay locked loop 100 and maintain a level of logic '1' after the operation of the delay locked loop 100. Thus, a first PMOS transistor MP1 is turned on by the reset bar signal RSTb before the operation of the delay locked loop 100 and a node (n1) is charged to a level of drive voltage VDD. After that, since the reset bar signal RSTb becomes logic '0', the first PMOS transistor MP1 and a second PMOS transistor MP2 are turned off and the node (n1) maintains the level of the drive voltage VDD before first and second NMOS transistors MN1 and MN2 are turned on.

The first output NAND logic NO1 may receive the error pulse P_err and the first error signal Err_d1 by an operation of the delay measuring circuit 142. The first and second NMOS transistors (MN1, MN2) are turned on by the error pulse P_err and the first error signal Err_d1, and then a node (n0) is discharged to a ground node GND, thus outputting a measuring signal Delay[0] of logic '0'.

As described above, when the error pulse generator 141 does not generate the error pulse P_err again after the first cycle, the first output NAND logic NO1 does not receive a new error pulse P_err and the first error signal Err_d1. Thus, the measuring signal (Delay[0]) of the first output NAND logic NO1 maintains logic '0'. The code generator 143 may make the delay code (Code_c[0]) to maintain logic '0'. The first through m+1th output NAND logics (NO1 to Nom+1) perform substantially the same operation. Consequently, the delay code generator 140 may maintain the initial delay code (Code_c[0:m]) even after the first cycle.

Figure 13:
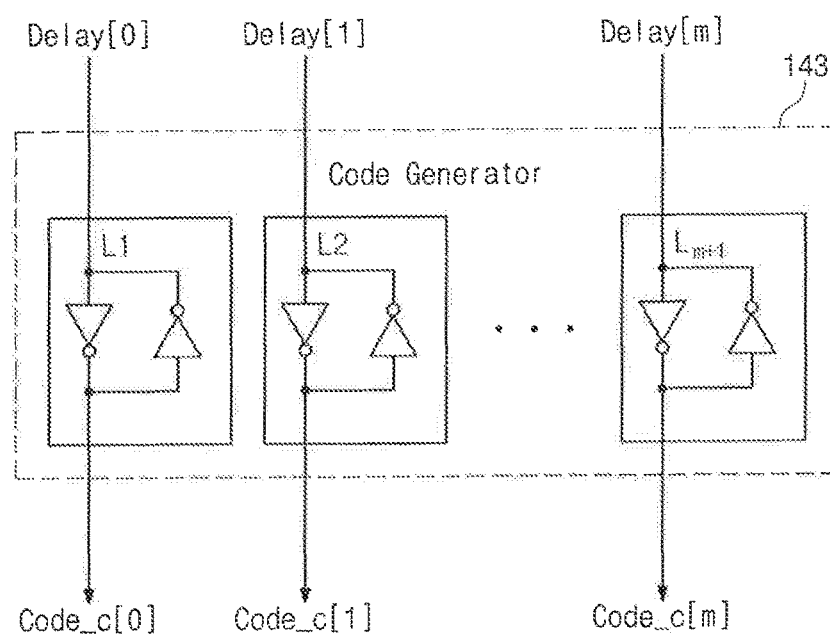
FIG. 13 is a circuit diagram illustrating a code generator of FIG. 7 according to an exemplary embodiment of the inventive concept.

FIG. 13 is a circuit diagram illustrating a code generator of FIG. 7 according to an exemplary embodiment of the inventive concept. The code generator 143 may include first through m+1th latches (L1 to Lm+1). Each of the first through m+1th latches (L1 to Lm+1) may include a pair of inverters. Input and output nodes of one of the pair of inverters are connected to output and input nodes of the other of the pair of inverters, respectively. The code generator 143 receives measuring signals (Delay[0:m]), amplifies a signal level of each of the measuring signals (Delay[0:m]), and generates the delay code (Code_d[0:m]). The code generator 143 maintains the generated delay code (Code_d[0:m]).

Figure 14:
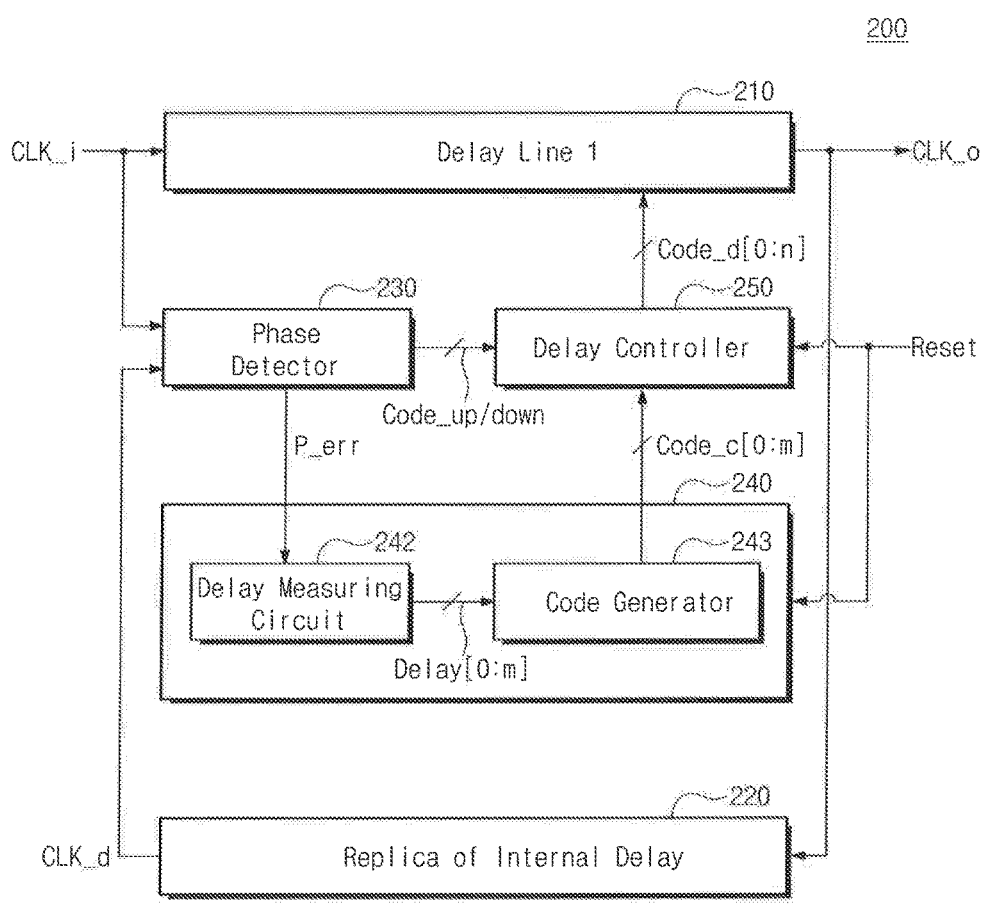
FIG. 14 is a block diagram illustrating a delay locked loop according to an exemplary embodiment of the inventive concept.

FIG. 14 is a block diagram illustrating a delay locked loop according to an exemplary embodiment of the inventive concept. A delay locked loop 200 may include a delay line 210, a replica of internal delay 220, a phase detector 230, a delay code generator 240, and a delay controller 250. The delay code generator 240 may include a delay measuring circuit 242 and a code generator 243. A configuration and operation of the delay locked loop 200 are substantially the same as those of the delay locked loop 100 of FIG. 1, except for the phase detector 230.

The phase detector 230 of FIG. 14 is connected to the replica of internal delay 220, the delay code generator 240, and the delay controller 250. As compared with the phase detector 130 of FIG. 1, the phase detector 230 receives the input clock signal CLK_i and the delay clock signal CLK_d to generate the phase detection signal and the error pulse P_err at substantially the same time. Since the phase detection signal and the error pulse P_err are generated based on the phase difference, they both can be generated by the phase detector 230. A configuration and operation of the phase detector 230 will be described below with reference to FIGS. 15 and 16.

Figure 15:
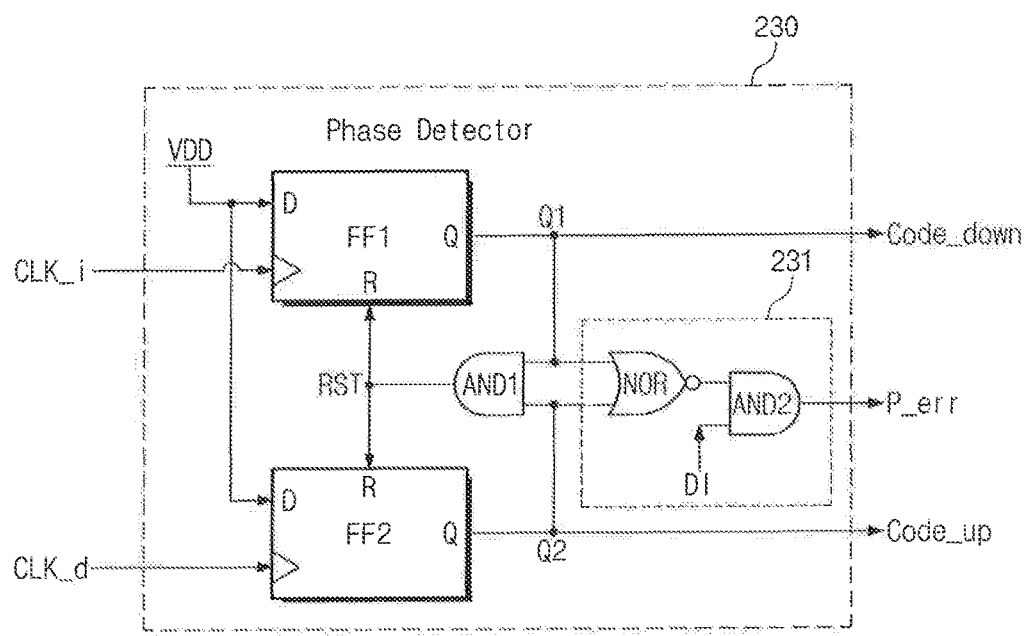
FIG. 15 is a circuit diagram illustrating a phase detector of FIG. 14 according to an exemplary embodiment of the inventive concept.

FIG. 15 is a circuit diagram illustrating a phase detector of FIG. 14 according to an exemplary embodiment of the inventive concept. The phase detector 230 may include first and second flip-flops (FF1, FF2), a first logical AND (AND1), and a pulse generating circuit 231. The pulse generating circuit 231 may include a logical NOR and a second logical AND (AND2). A configuration and operation of the first and second flip-flops (FF1, FF2) and the first logical AND (AND1) are substantially the same as those of the error pulse generator 141 of FIG. 8. Thus, a description thereof is omitted.

The first and second flip-flops (FF1, FF2) do not receive the data signal DI but receive the drive signal VDD (as compared with the error pulse generator 141 of FIG. 8). This is because the phase detector 230 may operate to perform a fine lock even after the first cycle or a coarse lock. Thus, the data signal DI is applied to the pulse generating circuit 231.

As described above, the data signal DI may be controlled to maintain logic '1' during the first cycle and maintain logic '1' after the first cycle. Thus, while the data signal DI maintains logic '1', the pulse generating circuit 231 operates as a general logical OR. While the data signal DI maintains logic '0', the pulse generating circuit 231 outputs logic '0' regardless of a change of an input signal. Thus, the phase detector 230 generates the same error pulse P_err as the error pulse generator 141 of FIG. 8.

A process of generating the phase detection signal of the phase detector 230 is described below with reference to FIG. 16. As described above, the phase detection signal may include the code rising signal (Code_up) and the code falling signal (Code_down).

Figure 16:
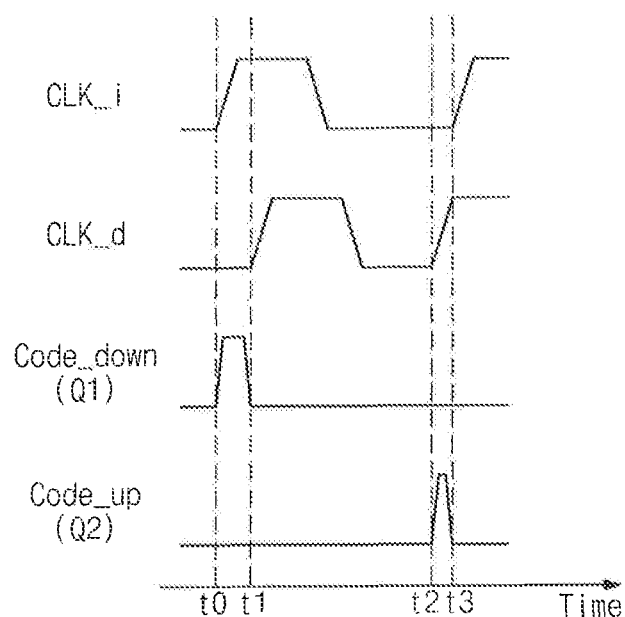
FIG. 16 is a timing diagram illustrating a phase detection signal generating operation of the phase detector of FIG. 15 according to an exemplary embodiment of the inventive concept.

FIG. 16 is a timing diagram illustrating a phase detection signal generating operation of the phase detector of FIG. 15 according to an exemplary embodiment of the inventive concept. FIG. 16 will be described with reference to FIG. 15. Referring to FIG. 16, the phase detector 230 compares the input clock signal CLK_i and the delay clock signal CLK_d to generate the code rising signal (Code_up) or the code falling signal (Code_down). An operation of the phase detector 230 is substantially the same as the operation of the error pulse generator 141 of FIG. 8. Thus, a detailed description thereof is omitted.

In a time section t0~t1, the delay clock signal CLK_d is delayed compared to the input clock signal CLK_i to be input to the phase detector 230. In this case, the first flip-flop FF1 generates a pulse signal that maintains logic '1' during the time section t0~t1, which is a phase difference between the input clock signal CLK_i and the delay clock signal CLK_d. In this case, the second flip-flop FF2 is reset by the pulse reset signal RST to output logic '0'.

In a time section t2~t3, the input clock signal CLK_i is delayed compared to the delay clock signal CLK_d to be input to the phase detector 230. In this case, the second flip-flop FF2 generates a pulse signal that maintains logic '1' during the time section t2~t3, which is a phase difference between the input clock signal CLK_i and the delay clock signal CLK_d. In this case, the first flip-flop FF1 is reset by the pulse reset signal RST to output logic '0'.

Consequently, the first discriminating signal Q1 includes information that the delay clock signal CLK_d is delayed compared to the input clock signal CLK_i. The first discriminating signal Q1 is output as the code falling signal (Code_down). The second discriminating signal Q2 includes information that the delay clock signal CLK_d is delayed compared to the input clock signal CLK_i. The second discriminating signal Q2 is output as the code rising signal (Code_up). The delay locked loop 200 adjusts a phase of the delay clock signal CLK_d according to the code falling signal (Code_down) or the code rising signal (Code_up).

Figure 17:
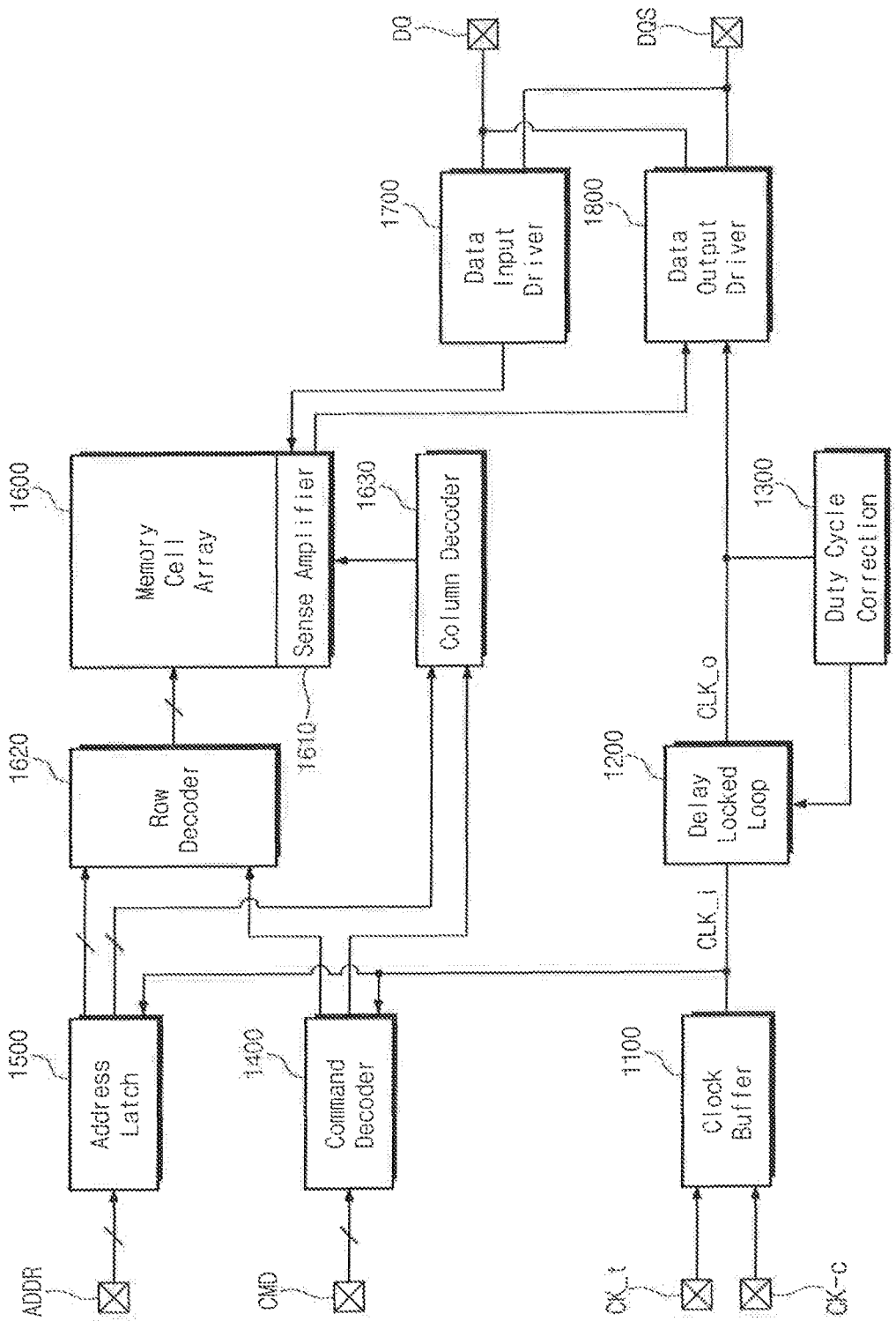
FIG. 17 is a block diagram illustrating a memory device including a delay locked loop according to an exemplary embodiment of the inventive concept.

FIG. 17 is a block diagram illustrating a memory device including a delay locked loop according to an exemplary embodiment of the inventive concept. Referring to FIG. 17, a memory device 1000 may include a clock buffer 1100, a delay locked loop 1200, a duty cycle correction 1300, a command decoder 1400, an address latch 1500, a memory cell array 1600, a sense amplifier 1610, a row decoder 1620, a column decoder 1630, a data input driver 1700, and a data output driver 1800.

For example, the memory device 1000 may be a volatile memory such as a dynamic random access memory (DRAM), a static random access memory (SRAM), a thyristor RAM (TRAM), a zero capacitor RAM (Z-RAM), a twin transistor RAM (TTRAM), a MRMA, etc.

The clock buffer 1100 may receive a clock signal from a pad (CK_t, CK_c) to generate the input clock signal CLK_i. The delay locked loop 1200 may be designed to compensate a delay time that occurs due to the clock buffer 1100 and the data output driver 1800 that exist on a transmission path of the input clock signal CLK_i inside the DRAM device. The duty cycle correction 1300 receives the output clock signal CLK_o from the delay locked loop 1200 and then corrects a duty of the output clock signal CLK_o to provide the corrected output clock signal CLK_o to the data output driver 1800.

The delay locked loop 1200 may correspond to the delay locked loop 100 or 200 described with reference to FIGS. 1 to 16. Thus, the delay locked loop 1200 may have a fast locking characteristic and thus, an operation time of the duty cycle correction 1300 is easily secured. Accordingly, an operation characteristic of the duty cycle correction 1300 may be guaranteed.

The command decoder 1400 receives various commands through a command pad CMD. The command decoder 1400 provides commands to circuit blocks such as the row decoder 1620 and the column decoder 1630.

The address latch 1500 receives an address of a memory cell accessed through an address pad ADDR. In the case where data is stored in a memory cell or data is read out from a memory cell, an address ADDR that selects a memory cell may be provided through the address latch 1500, the row decoder 1620, and the column decoder 1630.

The memory cell array 1600 may provide stored data to the data output driver 1800 through a sense amplifier 1610. The memory cell array 1600 may store data received from the data input driver 1700 in a predetermined address through the sense amplifier 1610. In this case, the row decoder 1620 and the column decoder 1630 may provide the address ADDR of a memory cell with respect to data to be inputted and outputted to the memory cell array 1600.

The data output driver 1800 may output data stored in the memory cell array 1600 through a data pad DQ. When outputting data, the data output driver 1800 may output a data strobe signal through a strobe pad DQS.

The data input driver 1700 may receive data provided through the data pad DQ to provide the received data to the sense amplifier 1610. When receiving data, the input driver 1700 may receive the data strobe signal through the strobe pad DQS.

Figure 18:
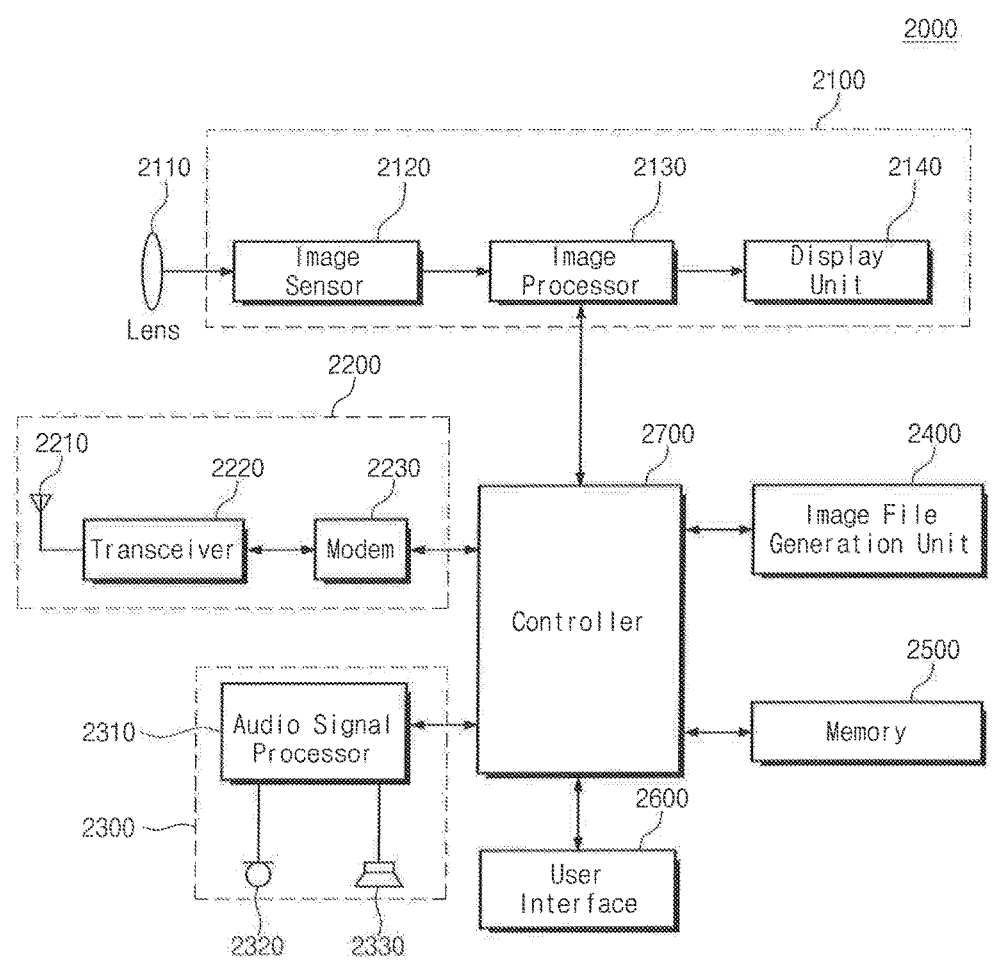
FIG. 18 is a block diagram of a user system including a volatile memory device according to an exemplary embodiment of the inventive concept.

FIG. 18 is a block diagram of a user system including a volatile memory device according to an exemplary embodiment of the inventive concept. A user system 2000 includes an image processing unit 2100, a wireless transmit/receive unit 2200, an audio processing unit 2300, an image file generating unit 2400, a memory 2500, a user interface 2600, and a controller 2700.

The image processing unit 2100 includes a lens 2110, an image sensor 2120, an image processor 2130, and a display unit 2140. The wireless transmit/receive unit 2200 includes an antenna 2210, a transceiver 2220, and a modem 2230. The audio processing unit 2300 includes an audio processor 2310, a mike 2320, and a speaker 2330.

The memory 2500 may be a memory module DIMM, a memory card (Multimedia Card (MMC), embedded MMC (eMMC), Secured Digital (SD), micro SD), etc. In addition, the controller 2700 may be provided as a system on chip that drives an application program, an operating system, etc. The controller 2700 may include the image processor 2130 or the modem 2230.

The memory 2500 may be provided as a memory device including the delay locked loop 100 or 200 as described with reference to FIGS. 1 to 16. The memory 2500 may also be provided as a memory module including the memory device 1000 described with reference to FIGS. 1 to 17. The memory 2500 may perform a rapid lock even in an external variable environment to provide a stable clock inside the memory device and guarantee quality of output data.

As described above, according to exemplary embodiments of the inventive concept, a delay locked loop can complete a coarse lock in a relatively short amount of time. Thus, the delay locked loop can guarantee an operation time taken to perform a fine lock and a duty correction after the coarse lock and thus, a clock signal of high quality may be generated.

While the inventive concept has been shown and described with reference to the exemplary embodiments thereof, it will be understood by those of ordinary skill in the art that various changes in form and details may be made thereto without departing from the spirit and scope of the present inventive concept as defined by the following claims.

What is claimed is:

1. A delay locked loop comprising:
    a delay line configured to delay an input clock signal in units of unit delay in response to a delay control code to generate an output clock signal;
    a delay circuit configured to delay the output clock signal to generate a delay clock signal;
    a phase detector configured to compare the input clock signal and the delay clock signal to generate a phase detection signal;
    a delay code generator configured to compare the input clock signal and the delay clock signal to detect a phase difference therebetween and generate a delay code using the phase difference; and
    a delay controller configured to generate the delay control code using the delay code and the phase detection signal,
    wherein the delay code generator comprises:
    an error pulse generator configured to compare the input clock signal and the delay clock signal to detect a phase difference, and generate an error pulse having a pulse width which is proportional to the phase difference;
    a delay measuring circuit configured to generate measuring pulses, whose number is proportional to the pulse width, using the error pulse; and
    a code generator configured to generate the delay code using each of the generated measuring pulses.

2. The delay locked loop of claim 1, wherein the delay code generator maintains the delay code, generated using a first cycle of the input clock signal, during a locking process of the delay locked loop.

3. The delay locked loop of claim 1, wherein the error pulse generator comprises:
    a first flip-flop configured to receive data at logic high, discriminate the data using an edge of the input clock signal to generate a first discriminating signal, and be reset by a pulse reset signal;
    a second flip-flop configured to receive the data, discriminate the data based on an edge of the delay clock signal to generate a second discriminating signal, and be reset by the pulse reset signal;
    a logical AND circuit configured to perform an AND operation on the first and the second discriminating signals to generate the pulse reset signal; and
    a logical OR circuit configured to perform an OR operation on the first and the second discriminating signals to generate the error pulse.

4. The delay locked loop of claim 1, wherein a time corresponding to the pulse width comprises n number of unit delays and the delay measuring circuit generates measuring pulses whose number is proportional to n.

5. The delay locked loop of claim 1, wherein the delay measuring circuit comprises a modeled circuit of the delay line.

6. The delay locked loop of claim 5, wherein the modeled circuit comprises delay stages whose number is less than the number of the delay stages of the delay line.

7. The delay locked loop of claim 1, wherein the code generator comprises a latch for each of the measuring pulses, and each of the latches is configured to receive one of the measuring pulses to generate the delay code.

8. The delay locked loop of claim 1, wherein the delay controller generates an initial delay control code using the delay code and shifts the initial delay control code in response to the phase detection signal to generate the delay control code.

9. The delay locked loop of claim 1, wherein the delay code and the delay control code are initialized by a reset signal.

10. A method of performing a coarse lock process using a delay locked loop, the method comprising:
    receiving, at a phase detector, an input clock signal and a delay clock signal, wherein the delay clock signal is an output clock signal of the delay locked loop that is delayed for a predetermined amount of time;
    determining, by the phase detector, a phase difference between the input clock signal and the delay clock signal to generate a phase detection signal;
    receiving, at a delay code generator, the input clock signal and the delay clock signal;
    generating, by the delay code generator, a delay code using the input clock signal and the delay clock signal;
    receiving, at a delay controller, the phase detection signal and the delay code;
    generating, by the delay controller, a delay control code using the phase detection code and the delay code; and
    receiving, at a delay line, the input clock signal and the delay control code to generate the output clock signal,
    wherein the coarse lock process is performed beginning with the delay control code having a value of the delay code with respect to the phase difference at a first cycle of the input clock signal, and
    the value of the delay code is maintained by the delay code generator during the coarse lock process.

11. The method of claim 10, wherein
    the delay locked loop performs a first loop and a second loop,
    the first loop includes receiving the phase detection signal and the delay code at the delay controller and generating the delay control code, and
    the second loop includes receiving the input clock signal and the delay clock signal at the delay code generator and generating the delay code.

12. The method of claim 10, further comprising:
    comparing, by the phase detector, the input clock signal with the delay dock signal to determine that the delay locked loop is coarse-locked; and
    completing the coarse lock process by generating a coarse lock signal.

13. The method of claim 10, further comprising:
    comparing, by the phase detector, the input clock signal with the delay dock signal to determine that the delay locked loop is not coarse-locked;
    generating the phase detection signal using the input clock signal and the delay clock signal, wherein the phase detection signal is either a code rising signal or a code failing signal; and
    updating the delay control code using the phase detection signal.

* * * * *